(12) United States Patent
Tegenbosch et al.

(10) Patent No.: US 7,184,128 B2
(45) Date of Patent: Feb. 27, 2007

(54) LITHOGRAPHIC APPARATUS AND DEVICE MANUFACTURING METHOD

(75) Inventors: Henricus Gerardus Tegenbosch, Eindhoven (NL); Sebastiaan Maria Johannes Cornelissen, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 281 days.

(21) Appl. No.: 10/875,505

(22) Filed: Jun. 25, 2004

(65) Prior Publication Data

US 2005/0286034 A1    Dec. 29, 2005

(51) Int. Cl.
*G03B 27/58* (2006.01)

(52) U.S. Cl. .................... 355/72; 355/53; 250/492.2

(58) Field of Classification Search .............. None
See application file for complete search history.

(56) References Cited

U.S. PATENT DOCUMENTS

| | | | | |
|---|---|---|---|---|
| 5,508,518 A | * | 4/1996 | Kendall | .................. 250/492.2 |
| 2001/0004105 A1 | * | 6/2001 | Kwan et al. | ............. 250/492.2 |
| 2004/0031932 A1 | * | 2/2004 | Vosters et al. | ........... 250/492.1 |

\* cited by examiner

*Primary Examiner*—D. Rutledge
(74) *Attorney, Agent, or Firm*—Pillsbury Winthrop Shaw Pittman LLP

(57) ABSTRACT

A lithographic apparatus is disclosed. The apparatus includes an illumination system for providing a beam of radiation, a support surface having an edge, and a support structure for supporting an object to be moved across the beam of radiation. The support structure is moveably supported on the support surface. The apparatus also includes a rim that is associated with the support surface. The support structure and the rim are configured to allow the support structure to move in a first direction toward the rim and collide with the rim. A total force generated by the collision on the support structure is at least partially directed away from a second direction that is opposite to the first direction.

11 Claims, 5 Drawing Sheets

LITHOGRAPHIC APPARATUS AND DEVICE MANUFACTURING METHOD

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

In both cases, the substrate and/or the mask must be moved across a projection beam that is generated by the apparatus. For this purpose a linear motor is typically provided, which drives a support structure (called a chuck) on which the substrate or mask is supported. The chuck is driven at high speeds in order to realize a high throughput. Existing chucks can be quite heavy, weighing e.g. as much as fifty kilograms. In order to reduce the load on the linear motor, the chuck is slideably supported on a support surface. Typically, the contact with the support surface is provided with air bearings and a suction cup, to minimize friction during motion and to prevent vertical movement of the chuck respectively.

The heavy weight of the chuck and its high speed of motion entail a substantial risk of damage when the chuck gets out of control. In particular, considerable collision forces may occur if the chuck would collide against the edge of the support surface at full speed. These forces can damage the linear motor and other parts of the lithographic apparatus.

SUMMARY

It is desirable to reduce the risk of damage to the lithographic apparatus due to high speed collisions of the support structure of the substrate and or patterning device.

According to an aspect of the invention, a lithographic apparatus is provided in which an object such as a wafer or a mask is moved across a beam on a wafer chuck that rests on a support surface. A rim structure is provided at an edge of the support surface. The rim structure and the wafer chuck are constructed so that upon collision of the wafer chuck and the rim structure, collision forces on the wafer chuck are directed away from a direction of motion of the wafer chuck, towards a center of mass of the wafer chuck. Preferably the colliding parts are positioned and/or shaped so that a total force generated upon collision causes substantially no net torque on the wafer chuck. In an embodiment the rim structure has a rim surface parallel to the edge so that the open angle between the support surface and the rim surface is obtuse. A protrusion is provided on the wafer chuck above the support surface. The rim surface and the protrusion form the colliding parts, so that the collision force on the wafer chuck is generated at the end of the protrusion and directed normal to the rim surface, away from the support surface.

In an embodiment, a lithographic apparatus is provided. The apparatus includes: an illumination system for providing a projection beam of radiation; a support surface having an edge; a rim structure located parallel to the edge of the support surface; and a support structure for supporting an object across the beam. The support structure is moveably supported on the support surface, to move the object with the support structure across the beam. Colliding parts of the rim structure and the support structure, which come into contact when the support structure collides against the rim structure, are positioned and/or shaped so that a total force generated on the support structure upon collision of the support structure and the rim structure is redirected at least partially away from a direction opposite to the direction of motion of the support structure over the support surface before the collision.

In an embodiment, the lithographic apparatus includes an illumination system for conditioning a beam of radiation; a support surface having an edge; and a support structure for supporting an object to be moved across the beam of radiation. The support structure is moveably supported on the support surface. A rim is associated with the support surface. The support structure and the rim are configured to allow the support structure to move in a first direction toward the rim and collide with the rim. A total force generated by the collision on the support structure is at least partially directed away from a second direction that is opposite to the first direction.

It is another aspect of the present invention to provide a device manufacturing method. The method includes providing a beam of radiation using an illumination system, and moving an object across the beam on a support structure that rests on a support surface. A rim structure is associated with the support surface. The method also includes directing collision forces on the support structure, upon collision of the support structure and the rim structure, away from a direction opposite to a direction of motion of the support structure and towards a center of mass of the support structure before the collision.

In an embodiment, a device manufacturing method includes providing a beam of radiation, and moving a support structure that supports an object across the beam of radiation. The support structure moves in a direction across a support surface until it collides with a rim that is disposed adjacent an edge of the support surface. The method also includes directing collision forces acting on the support structure away from a direction that is opposite the direction of motion.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

The invention provides for selective positioning and/or shaping of the colliding parts of a rim structure and the support structure that come into contact when the support structure collides against the rim structure of the support surface. These colliding parts are positioned and/or shaped so that a total force on the support structure that is generated upon collision of the support structure and the rim structure is directed at least partially away from the direction of motion of the support structure. Preferably, the force is redirected so that it is directed closer to the center of mass of the support structure than if it were directed opposite to the direction of motion before collision. Typically, a wafer chuck is a top heavy structure, with its center of mass well above the support surface, so that the force is preferably redirected upward from the support surface.

The force may be redirected so that it causes substantially no net torque on the support structure. "Substantially no net torque", in this context, means that the net torque does not exceed a level that would cause irreversible damage to the apparatus in case of a collision at full speed. The total force generated upon collision includes the collision force of the colliding parts and corresponding response forces, like a force exerted by the suction cup of the support structure when the collision force tends to lift the support structure from the support surface.

This may be realized by positioning and/or shaping the colliding parts so that the collision force is directed substantially towards the operational center of mass of the support structure, so that the collision force causes substantially no torque. The center of mass of the support structure is typically well above the support surface, so that the collision force must be directed upward for this purpose.

In an embodiment, a suitably directed collision force may be realized by providing a rim structure located at the edge of the support surface, the rim structure having a rim surface into which a protrusion on the support structure collides, with the rim surface forming an obtuse angle with the support surface. As a result of this angle, the collision force is redirected partially upward, preferably towards the center of mass of the support structure.

In an embodiment, a rotatably mounted ball, or other cylindrically symmetric element, is provided at the extremity of the protrusion so that the point of impact of the protrusion is able to roll around an axis that is parallel to a surface with which it collides. Thus, the direction of the collision force will hardly be affected by friction forces.

Figure 1:
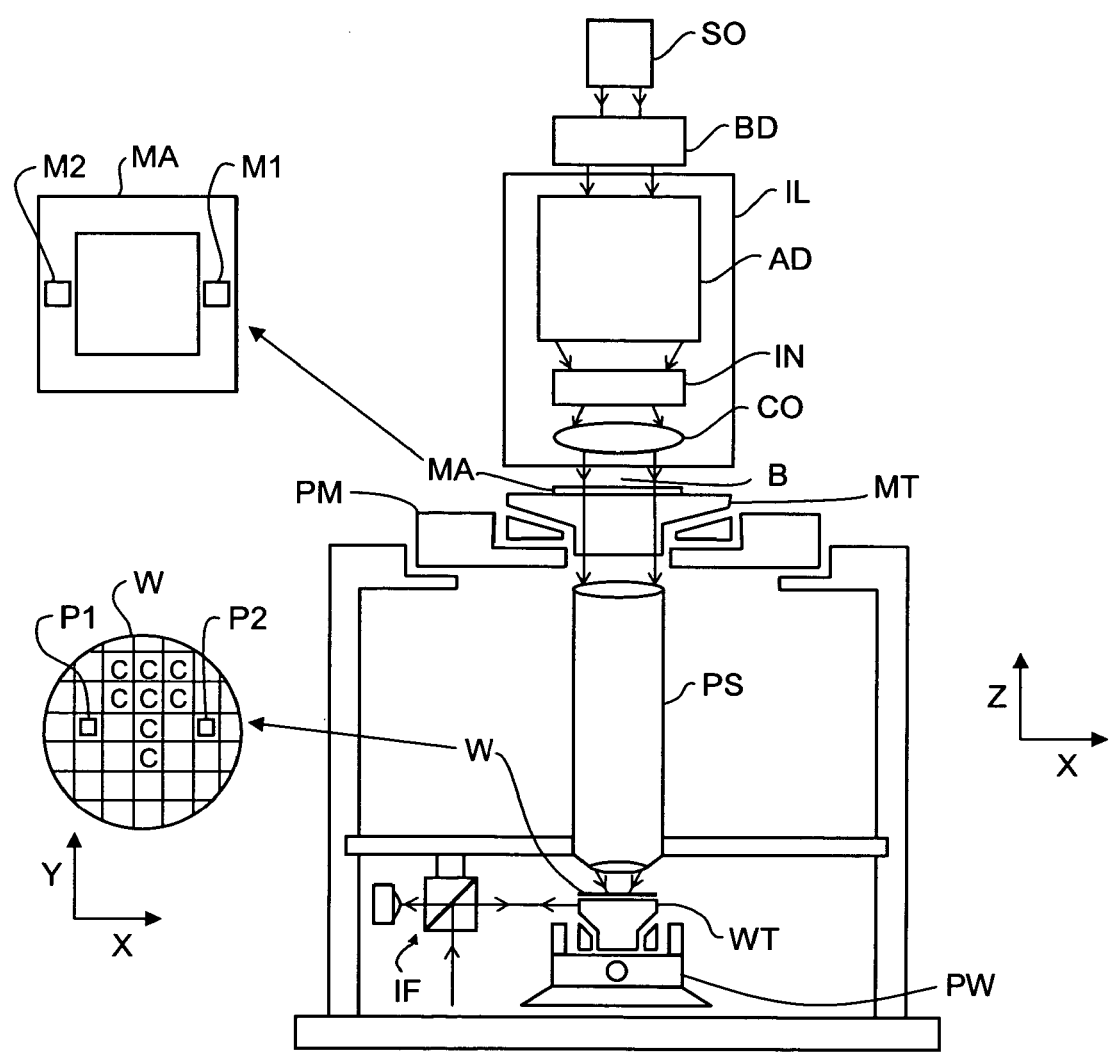
FIG. 1 shows a lithographic apparatus according to an embodiment of the invention.

FIG. 1 schematically depicts a lithographic apparatus according to one embodiment of the invention. The apparatus includes: an illumination system (illuminator) IL configured to condition a radiation beam B (e.g. UV radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as, for example, whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example, if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks, as illustrated, occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
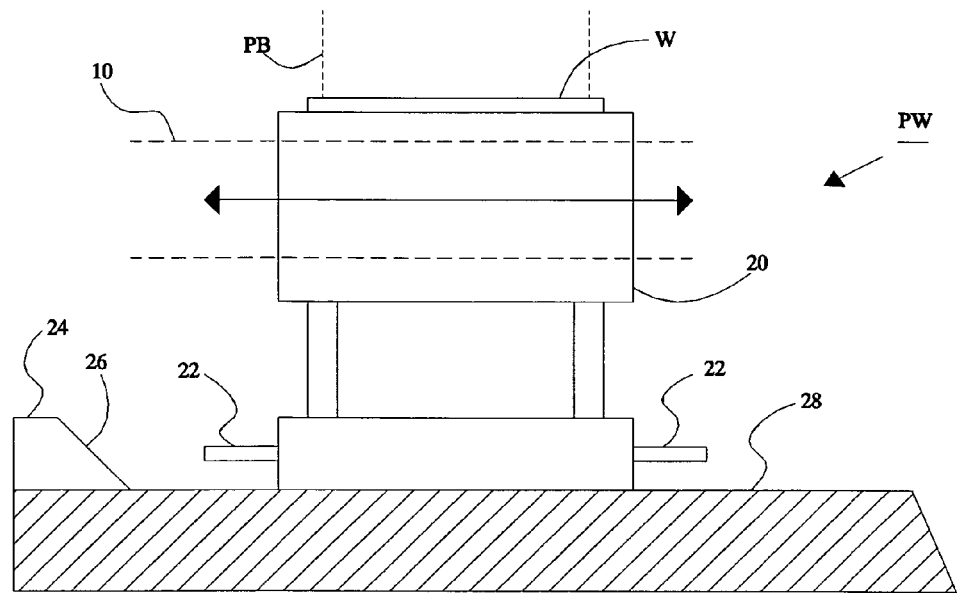
FIG. 2 shows a wafer chuck of the apparatus of FIG. 1.

FIG. 2 shows a more detailed schematic diagram of the second positioner PW for the substrate table. The second positioner PW contains a linear motor 10, and a chuck 20 is attached to the moving part of the linear motor 10. In addition, the chuck 20 is supported on a support surface 28, such as a table made of stone. At an edge of the support surface 28, a rim structure 24 is attached to the support surface 28. The rim structure 24 is shown in cross-section; it extends along the edge of the support surface 28 in a direction perpendicular to the plane of the drawing. As shown, the rim structure 24 has an oblique surface 26 rising from the support surface 28 at the point where the chuck 20 may come into contact with the rim structure 24. That is, the oblique surface 26 forms an obtuse angle (>90 degrees) with the support surface 28. Only one rim structure 24 is shown in the figure, but a similar rim structure may be provided that is mirrored symmetrically on an opposite edge of the support surface 28. As used herein, an "edge" of the support surface 28 is defined by the location of the rim structure 24. Preferably, the support surface 28 (e.g. a stone table) ends at the rim structure 24, but without deviating from the invention, the table may extend further behind the rim structure 24.

The base of the chuck 20 is provided with protrusions 22, at least one of which extends towards the rim structure 24 at a level where the oblique surface 26 is present, so that, when the chuck 20 moves over the support surface 28 towards the rim structure 24, a protrusion 22 is the first part to contact the rim structure 24, with the point of contact occurring on the oblique surface 26. Preferably, the angle of the oblique surface 26 is selected to that the normal from the oblique surface 26 from the point of contact is directed towards the operational center of mass of the chuck 20. This center of mass typically lies well up above the support surface 28, e.g. at the level of the linear motor 10 since the bearings with which the chuck 20 is coupled to the linear motor 10 form an important component of the mass of the chuck 20; also, actuators for the alignment of a table surface of the chuck 20 and their connections are located near the level of the linear motor 10. As shown, similar protrusions 22 may be provided on opposite sides of the chuck 20, for cooperation with the rim structures 24 on respective edges of the support surface 28.

Figure 3:
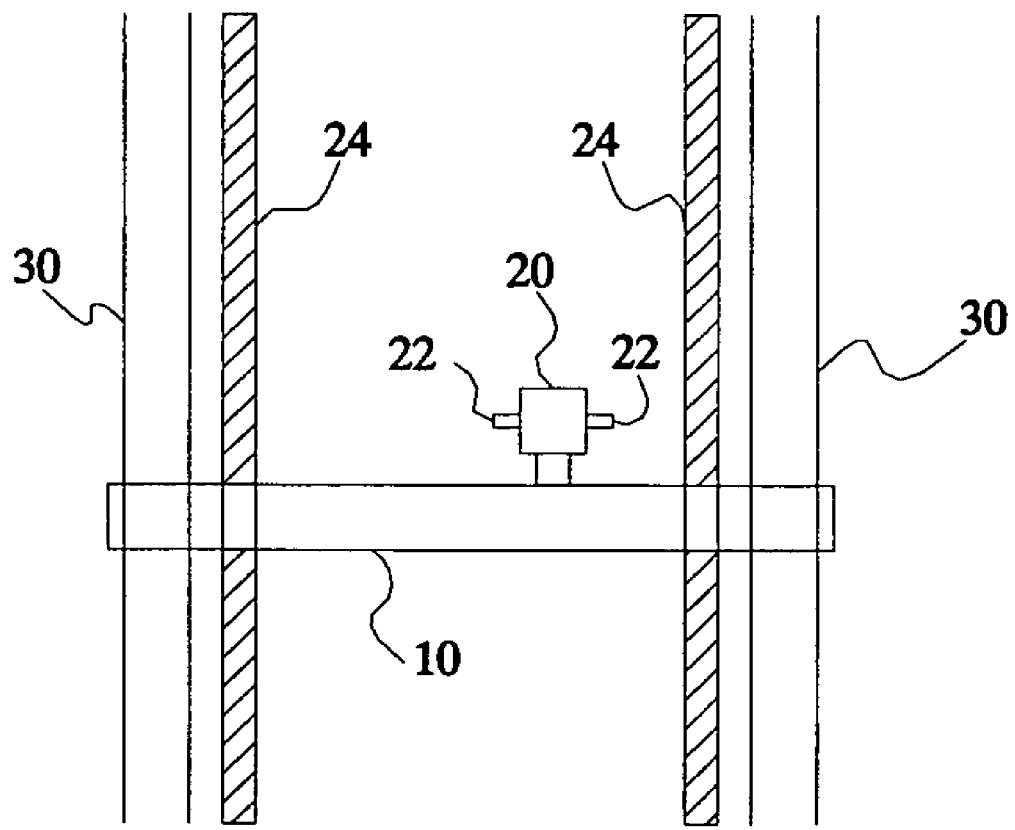
FIG. 3 shows a top view of a movement system of the apparatus of FIG. 1.

FIG. 3 shows the second positioner PW in a top view. The linear motor 10, which will be referred to in the context of this figure as the X-motor 10, is provided to drive the chuck 20 in a first direction, called the X-direction (horizontally in the figure). A pair of linear Y-motors 30 is provided for movement in a second direction, called the Y-direction (shown vertically in the figure, although in physical reality both the X and Y direction lie in a horizontal plane). The X motor 10 is suspended between the moving parts of the Y-motors 30. The chuck 20 is connected to the moving part of the X-motor 10. The rim structures 24 extend along the Y-direction, defining the support surface 28 for the chuck 20. The protrusions 22 are directed toward the rim-structures 24.

Figure 4:
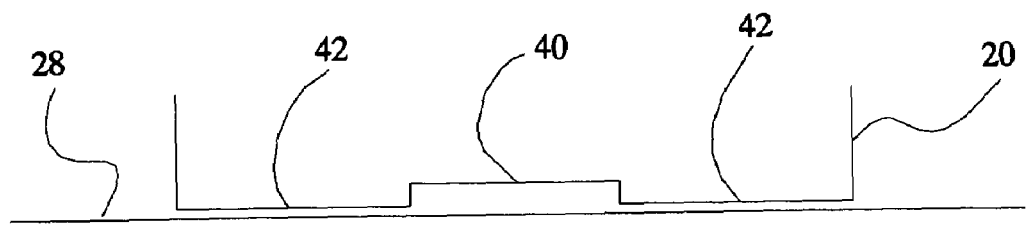
FIG. 4 shows a detail of a support structure and a support surface of the apparatus of FIG. 1.

FIG. 4 shows the base of the chuck 20 in more detail, as it is supported on the support surface 28. The base of the chuck 20 contains a central vacuum cup 40, surrounded by gas bearings 42. In operation, gas is supplied through openings (not shown) in the gas bearings 42 and the vacuum cup 40 is pumped. In this way, two counteracting forces are generated: a net pull-down force due to the lack of pressure in the vacuum cup 40 and a lift force due to gas pressure in the gas bearings 42.

Typically, the vacuum cup 40 and the gas bearings 42 are designed so that these forces significantly exceed the force of gravity due to the weight of the chuck 20. In operation, the pull-down force is, for example, approximately ten times this force of gravity and the lift force is equal to the pull-down force plus the force of gravity. In this way, the vacuum cup 40 serves to pretension the gas bearings 42. The force produced by the gas bearings 42 represents a much higher stiffness than the force due to the vacuum cup 40. As the distance between the lower surface of the chuck 20 and the support surface 28 increases, the lift force due to the gas bearings 42 decreases much more rapidly than the pull-down force due to the vacuum cup 40. As a result, the chuck 20 is kept near the support surface 28, e.g. at a distance of approximately ten micrometers in the gas bearings 42. The vacuum cup 40 is located below the center of mass of the chuck 20, and the gas bearings 42 are located symmetrically around the vacuum cup 40, so that no net torque arises due to the pull-down force and the lift force when the distance varies.

In operation, the rim structure 24 and the protrusion 22 serve to prevent damage to the chuck 20 and/or the linear motor 10 and/or other parts of the lithographic apparatus if, by accident, the chuck 20 attempts to move at a high speed through the edge of the support surface 28 when being driven by the linear motor 10. When this happens, the rim structure 24 forces the chuck 20 to make a sudden halt, or even recoil. If the collision force were directed along the normal direction of motion of the chuck 20, i.e. in parallel to the support surface 28, considerable damage may arise, mainly due to the torque on the chuck 20 generated by the collision. This torque may be considerable, because the mass of the support structure is large (typically of the order of fifty kilograms), while the center of mass of the chuck 20 is at a considerable height (e.g. fifteen centimeters above support surface).

The collision force arises at the point of contact between the protrusion 22 of the chuck 20 and the oblique surface 26 of the rim structure 24. The collision force is directed normal to the oblique surface 26. The angle of the oblique surface 26 is selected so that the normal of the oblique surface 26 at the point of contact with the protrusion 22 is directed at the center of mass of the chuck 20. As a result, the collision force generates no torque on the chuck 20, but only a central force. The component of this central collision force in the vertical direction causes the chuck 20 to lift, but this is compensated by the force due to the vacuum cup 40, so that the vertical position is readily restored. The horizontal component of the central collision force causes the chuck 20 to recoil, after which a desired position can be resumed through the action of the linear motor 10.

Figure 5:
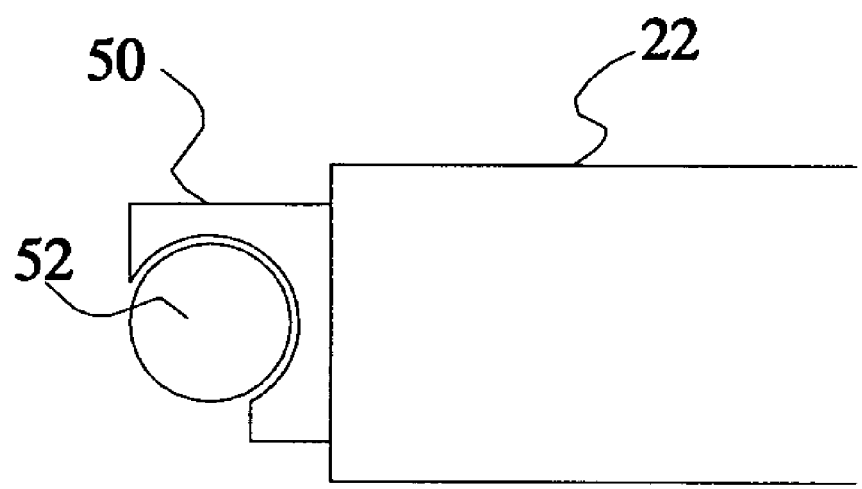
FIG. 5 shows an extremity of a protrusion of the support structure of FIG. 4.

FIG. 5 shows an embodiment of the protrusion 22, which contains a rotatably mounted bearing ball 52 at the extreme of the protrusion 22, so that the bearing ball 52 first contacts the oblique surface (not shown) in case of a collision. In this way, the effect of friction on the direction of the collision force may be minimized. In the illustrated embodiment, the ball 52 is mounted in a socket 50 such that the ball 52 is freely rotatable, e.g., via a bearing surface. Alternatively, the ball 52 may be rotatable around an axis that is parallel to the rim surface 26 (not shown). Instead of a ball, a cylindrical roller may be used.

According to an embodiment, the combination of the rim structure 24 and the protrusion 22 may be used to redirect the collision force at least partly away from the direction of motion, so that a torque on the chuck 20 may be smaller than the torque that would be generated on the chuck 20 if the collision force were directed along the direction of movement of the chuck 20. Although preferably the rim structure 24 and the chuck 20 are arranged so that zero total torque is generated when a collision occurs, it should be understood that an arrangement that keeps the torque small, without actually making it zero, also suffices. In practice, the torque may never be exactly zero. It suffices that, even under worst case collisions, the torque is kept sufficiently small so that it causes no damage.

Although the invention has been illustrated using a specific embodiment, it should be appreciated that the invention is not limited to this embodiment. For example, although an oblique rim surface 24 and a relatively sharp protrusion 22 have been shown, so that the oblique surface 24 determines the direction of the collision force, it should be understood that, alternatively, a protrusion with an oblique surface and a relatively sharp rim structure may be used, so that the oblique surface of the protrusion determines the required direction of the collision force. For sufficiently low friction surfaces, oblique surfaces may be used on both the protrusion 22 and the rim structure. It will be appreciated that the oblique surface, wherever it is located, need only have the required angle over a limited range of heights where the collision can occur.

Instead of a single protrusion 22 on a side of the chuck 20, a plurality of protrusions may be used, or a protrusion that extends in parallel with the rim structure 24 over some distance. These protrusions may be located symmetrically with respect to the center of mass of the chuck 20 so that substantially no net torque results for a collision. In the case of a continuous protrusion, the rim structure may be an interrupted structure.

Although the invention has been illustrated using an embodiment wherein the collision force is redirected upwards, it should be understood that alternatively, the collision force may be redirected downwards, e.g. by providing a rim structure 24 above the center of mass of the chuck 20 with an oblique surface that forms a sharp angle with the support surface 28.

Although embodiments have been shown for the second positioner PW of the substrate W (wafer), it should be understood that similar measures may be taken instead, or as well, for the first positioner PM of the mask M. Also, although embodiments have been illustrated for a lithographic apparatus with a transmissive mask, it is understood that the invention can also be applied to a lithographic apparatus with a reflective mask. In this case, the center of mass of the first positioner PM for the mask is typically well above the support surface used for the first positioner PM, which typically makes measures against damage by collisions more desirable.

Although in the described embodiment, a zero net torque may be realized because both the collision force and the force due to the vacuum cup 40 are directed towards the center of mass of the chuck 20, it should be appreciated that alternative embodiments are possible wherein the chuck 20 and the rim structure 24 are configured so that the collision force and the force due to the vacuum cup 40 exert opposite torques, so that the sum of the torques is essentially zero. Upon collision, the size of the force due to the vacuum cup 40 is related to the size of the collision force because it roughly compensates the vertical component of the collision force. By a proper selection of the arm lengths through which these forces exert torques, the sum of the torques may be zero. However, such a solution may have additional challenge because more complicated measures may be needed if damages due to collisions at different edges of the support surface 28 must be prevented. In this case, the arrangement is preferred wherein both the collision force and the force due to the vacuum cup 40 are made substantially zero.

Although an arrangement with a vacuum cup 40 and a gas bearing 42 have been used, it will be understood that the use of other types of forces are possible, using, for example, a magnetic bearing, a roller bearing, etc., instead of the vacuum cup 40 and/or the gas bearing 42.

Although the rim structures 24 have been shown on two mutually opposite edges of the support surface 28, it will be understood that with a rim surface on one edge, damage may be prevented if only collisions at that edge are possible or damaging. Also, the rim structures 24 may be provided on other edges and/or on more than two edges of the support surface, e.g. also along edges that extend along the X-direction. However, the rim structures 24 that block collisions due to movement driven by the X-motor 20 are advantageous, because the X-motor 20, as shown, is carried by other motors and should be relatively lightweight, thereby making it more vulnerable to damage. Damage due to collision after Y-movement is usually less problematic, because of the stronger construction of the Y-motors 40. Therefore, a special rim may not be needed.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example, imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5–20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
   an illumination system for conditioning a beam of radiation;
   a support surface having an edge;
   a support structure for supporting an object to be moved across the beam of radiation, the support structure being moveably supported on the support surface; and
   a rim associated with the support surface, wherein the support structure and the rim are configured to allow the support structure to move in a first direction toward the rim and collide with the rim, wherein a total force generated by the collision on the support structure is at least partially directed away from a second direction that is opposite to the first direction.

2. A lithographic apparatus according to claim 1, wherein the support structure and the rim are constructed and arranged to direct the total force in a direction that causes substantially no net torque on the support structure during the collision.

3. A lithographic apparatus according to claim 1, wherein the support structure and the rim are constructed and arranged to direct the total force in a direction substantially toward a center of mass of the support structure.

4. A lithographic apparatus according to claim 3, wherein the center of mass of the support structure lies further distant from the support surface than a point where the support structure and the rim collide.

5. A lithographic apparatus according to claim 1, wherein the rim has a rim surface inclined with respect to the normal of the support surface to define an obtuse open angle between the support surface and the rim surface, the support structure having a protrusion extending from the support structure at a level above the support surface, such that the rim surface and the protrusion collide during the collision.

6. A lithographic apparatus according to claim 5, comprising an at least cylindrically symmetric element mounted at an extremity of the protrusion, shaped so that the at least cylindrically symmetric element first collides with the rim surface when the support structure collides with the rim, the at least cylindrically symmetric element being at least rotatably mounted around an axis that runs parallel to the edge.

7. A lithographic apparatus according to claim 1, wherein the object is a substrate onto which the beam is projected after patterning.

8. A lithographic apparatus according to claim 1, wherein the object is a mask with which the beam is patterned.

9. A device manufacturing method comprising:

providing a beam of radiation using an illumination system;

moving an object across the beam on a support structure that rests on a support surface, wherein a rim structure is associated with the support surface; and directing collision forces on the support structure, upon collision of the support structure and the rim structure, away from a direction opposite to a direction of motion of the support structure and towards a center of mass of the support structure before the collision.

10. A device manufacturing method comprising:

providing a beam of radiation;

moving a support structure that supports an object across the beam of radiation, the support structure moving in a direction across a support surface until it collides with a rim that is disposed adjacent an edge of the support surface;

directing collision forces acting on the support structure away from a direction that is opposite the direction of motion.

11. A device manufacturing method according to claim 10, wherein the collision forces are directed toward a center of mass of the support structure.

* * * * *